United States Patent [19]

Cooke et al.

[11] Patent Number: 5,051,096
[45] Date of Patent: Sep. 24, 1991

[54] PLANAR BOARD SUPPORT STRUCTURE

[75] Inventors: Kevin K. Cooke, Delray Beach; John R. Dewitt, Boca Raton; Paul J. Galinis, Boynton Beach; Walter B. Koteff, Boca Raton, all of Fla.

[73] Assignee: International Business Machines Corp., Armonk, N.Y.

[21] Appl. No.: 425,525

[22] Filed: Oct. 23, 1989

[51] Int. Cl.$^5$ .............................................. H01R 9/09
[52] U.S. Cl. ...................................... 439/61; 361/413
[58] Field of Search .................. 439/61, 64, 65, 55; 29/876; 211/26, 40, 41; 361/413, 415, 395

[56] References Cited

U.S. PATENT DOCUMENTS

| | | | |
|---|---|---|---|
| 4,235,496 | 11/1980 | Aug et al. | 361/413 X |
| 4,602,317 | 7/1986 | Rovnyak et al. | 361/413 |
| 4,731,698 | 3/1988 | Millot et al. | 361/413 X |
| 4,744,006 | 5/1988 | Duffield | 361/413 |

OTHER PUBLICATIONS

IBM Technical Disclosure Bulletin, vol. 19, No. 1, Jun. 1976, Card on Segmented Board Electronic Package.

Primary Examiner—Neil Abrams
Assistant Examiner—Khiem Nguyen
Attorney, Agent, or Firm—Winfield J. Brown, Jr.; Stephen A. Terrile

[57] ABSTRACT

An improved planar support structure for a planar of a personal computer system is comprised of an integral structure having a plurality of connector support frames. The planar support structure is interposed between the planar and a supporting structure and securely fastened to each. Each frame surrounds the perimeter of a corresponding connector of the expansion slots on the planar. Each frame supports a connector to prevent the connector from flexing the planar when an adapter board is inserted into the connector. Additional alignment pins associated with the planar support structure improve ease of assembly during construction of the system.

4 Claims, 4 Drawing Sheets

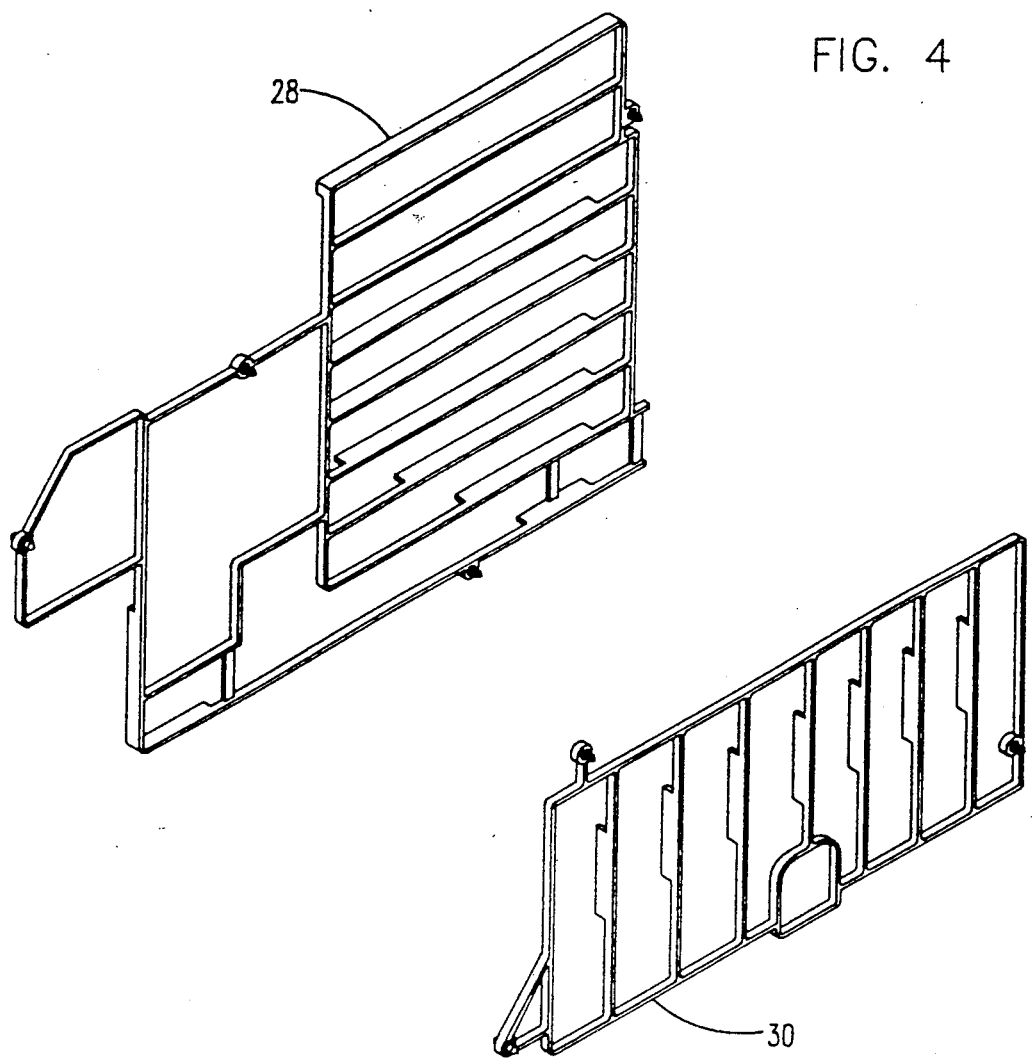
FIG. 4
FIG. 4a
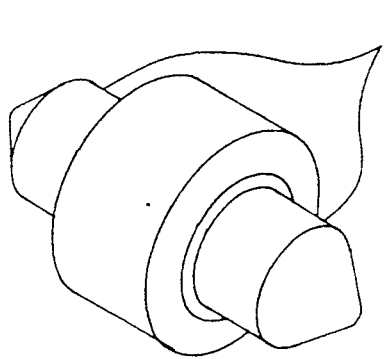
FIG. 4b
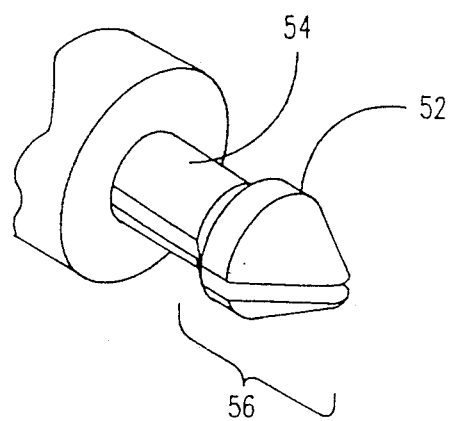

PLANAR BOARD SUPPORT STRUCTURE

FIELD OF THE INVENTION

This invention relates to personal computer systems in general and in particular to a method and apparatus for preventing a motherboard or planar of the computer system from flexing during insertion of circuitry components.

BACKGROUND OF THE INVENTION

Personal computers have become increasingly necessary in today's high technological society. These systems can usually be defined as desk top, floor standing, or portable unit that consists of a system unit having a single system processor, a display monitor, a keyboard, one or more diskette drives, a fixed disk, and an optional printer. The centerpiece of the computer system is the printed circuit board which holds and connects the system processor and its support circuitry. This printed circuit board is usually referred to as the planar. A typical planar is made from a flat sheet of glass-epoxy with the actual circuitry etched from two or more layers of conductive copper that form traces which carry the electrical signals between the electronic components fastened to the planar. Installed on the planar are a number of expansion slots which are pathways that permit electrical signals to connect with the system processor. A typical planar will accept a number of different circuitry components, such as adapter boards, I/0 boards or memories, which are plugged into the expansion slots affixed to the planar. Normally the expansion slot is in the form of a female connector with the circuitry component normally having a corresponding male-edge connector. During the installation of these circuitry components, insertion force is required to insert the edge connectors of the boards into the corresponding female connector on the planar. This force will vary depending on the number of physical contacts on the edge connector and the alignment of the connectors, and the tolerance conditions.

During insertion, forces may be generated by a user on the planar assembly which can cause the planar to flex. When this happens, not only does the planar flex but the traces comprised of the numerous electrical leads and paths running from the connectors to the processor and other components on the planar are flexed. If the traces are flexed enough severe deterioration of the traces results. In fact, enough force can be applied to the planar to cause the traces to break. As is evident, the loss of a trace on the planar can result in failure in the operation of the personal computer system.

One way of preventing the flexing of the planar is to provide a plurality of supports between the planar and the housing. In the past, these supports usually take the form of a nut and bolt with insulating washers, which are inserted between the planar and the computer housing. In some cases the fastener is comprised of plastic or other insulating material to provide an electrical isolation between the planar and the housing. These supports, while providing some relief from the flexing problems, have not totally solved the problem since they only provide support at one particular point in the planar. As can be expected, even if these supports are situated close to an extension slot, the board can still flex in between the supports causing damage to the traces. Also it is important to point out that increasing the number of these supports is undesirable because it decreases the real estate on the planar and increases cost due to the additional hardware and time of assembly.

SUMMARY OF THE INVENTION

The present invention has been developed for the purpose of alleviating the above mentioned problems. Accordingly, the invention has as one of its objects an apparatus and method for preventing the flexing of a planar caused by the insertion of circuitry components.

It is another object of the present invention to provide a device which prevents flexing of the planar while not reducing the real estate of the planar.

It is another object of the present invention to prevent contact between the planar and the metallic housing of the personal computer system that would result in damage or unsafe electrical shortage.

BRIEF DESCRIPTION OF THE DRAWINGS

The foreground aspects and other features of the present invention are explained in the following written description, taken in connection with the accompanied drawings, wherein:

FIGS. 4, 4a and 4b show the planar's supports and magnified blowups of their mounting snaps and positioning pins.

DETAILED DESCRIPTION OF A PREFERRED EMBODIMENT OF THE PRESENT INVENTION

The following detailed description is of the best presently contemplated mode for carrying out the invention. This description is not to be taken in a limiting sense but is made merely for the purpose of illustrating the general principles of the invention since the scope of the invention is best defined by the appended claims.

Referring to the figures in general, there is shown a method and apparatus which is used to provide support for a planar assembled into a personal computer system. The planar support structure improves the ability and prevents flexing of the planar when circuit components are inserted into expansion slots included on the planar.

Figure 1:
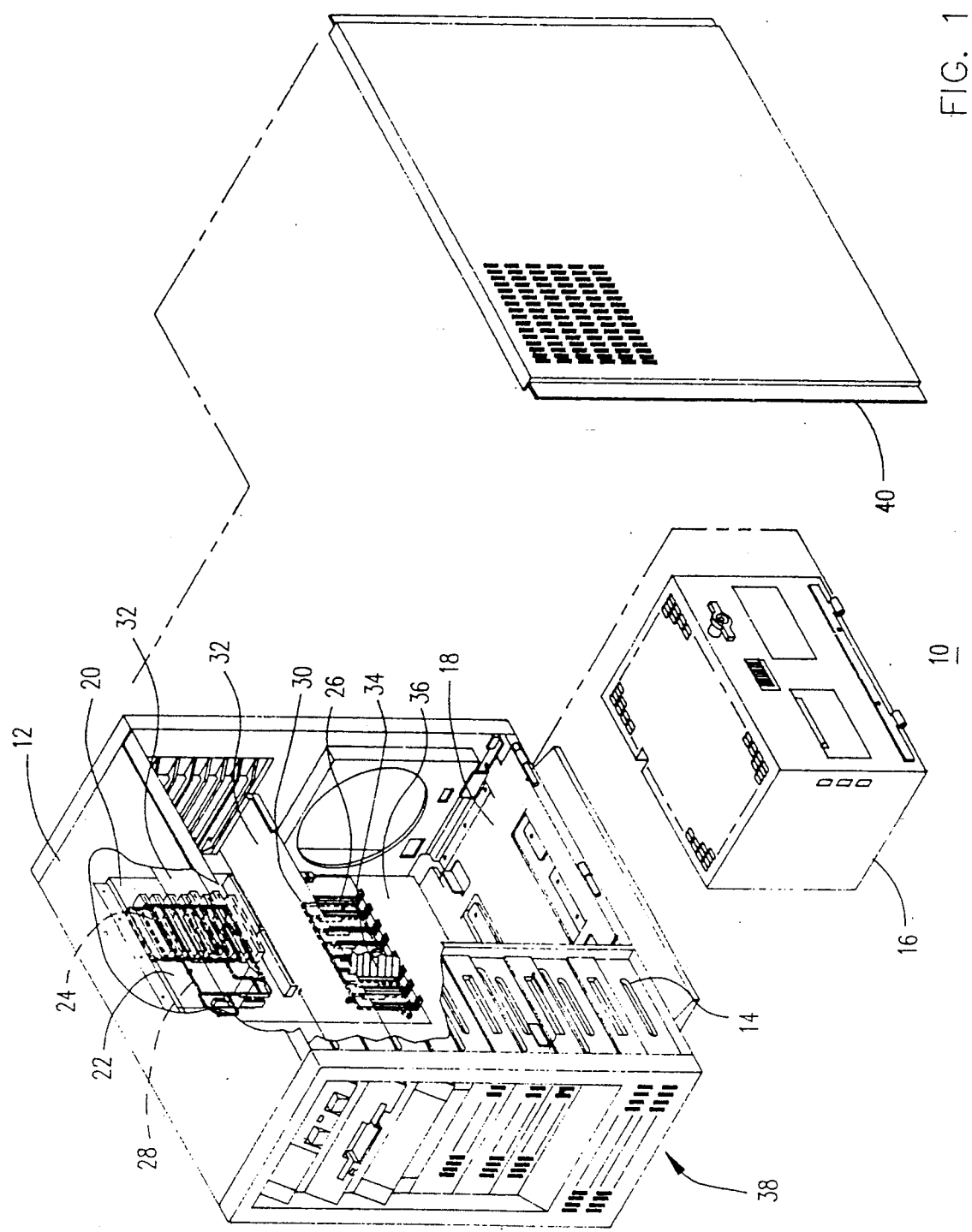
FIG. 1 shows an exploded view of a personal computer system embodying the present invention which illustrates the entire system's unit assembly, the planar supports, their relative position, and their associated parts.

Referring now to FIG. 1 there is shown an exploded view of a personal computer system 10 embodying the present invention. The personal computer system 10 includes an enclosure assembly 12, a DASD assembly 14, a power supply 16, an inner support structure 18, and a planar board assembly 20. The planar board assembly 20 includes a planar board 22, expansion slots 24 and 26, and planar board supports 28 and 30 (shown in dotted line). The planar assembly 20 is fastened to the inner surface 36 of the enclosure assembly 12. A front cover 38 and side panel 40 complete the personal computer system 10.

In operation, a plurality of circuitry components such as adapter cards 32 and memory modules 34 are inserted into a planar 22. The expansion slots 24 include a plurality of connectors which are used to provide electrical connection between the adapter cards 32 and the planar circuitry. Additionally, expansion slot 26 includes a plurality of connectors to provide electrical connection for memory modules and other circuitry components necessary for the operation of the personal computer system. The operation of the personal computer system is well known and is not described here since it is not necessary for an understanding of the present invention. As is well known, the planar assembly 20 must be electrically isolated from the enclosure 12 to prevent electrical shorts and non operation of the system. In addition, a plurality of direct access storage devices can be installed in the DASD assembly 14 for the operation of the personal computer system.

Figure 2:
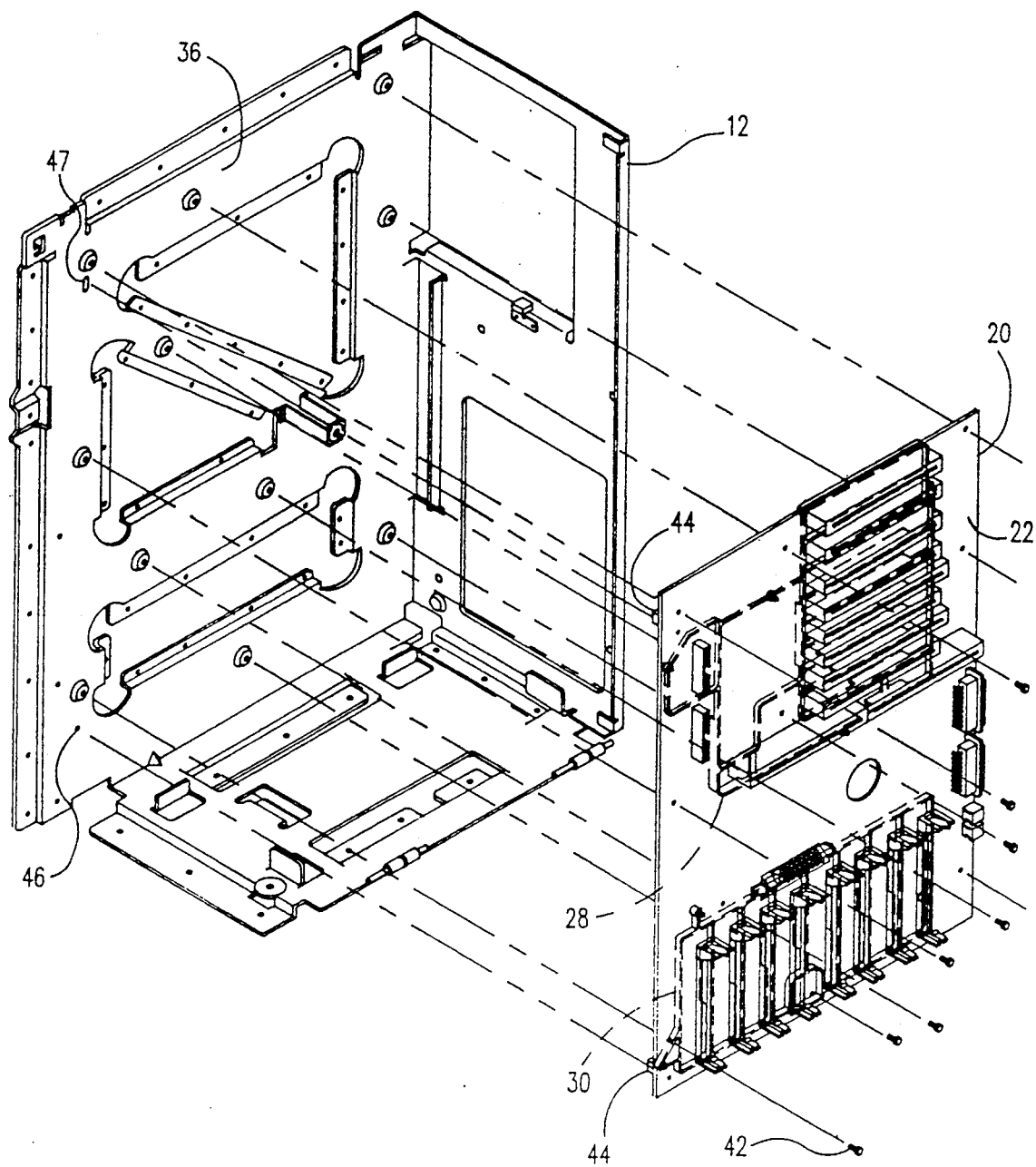
FIG. 2 illustrates the assembly of the planar assembly and planar supports to the inner support structure of the enclosure.

Referring now to FIG. 2, there is shown the planar board assembly 2 removed from the inner surface 36 of the enclosure. The planar assembly 20 comprised of the planar 22 and the planar board supports 28 and 30 (shown in dotted line) are mounted to the inner structure by fastening means such as screws or bolts 42. The alignment of the planar assembly is achieved through the use of alignment pins 44 which are aligned to a corresponding alignment hole 46 and slot 47 located on the inner structure 36. With the supports 28 and 30 secured to the planar and inner support structure 36, the planar is provided with the support necessary to retain the circuitry during assembly and operational use. During installation of the planar into the enclosure, the alignment is improved through the use of the alignment pins 44 to eliminate the possibility of having any of the electrical components shorted out or damaged during installation of the planar into the inner structure of the enclosure.

Figure 3:
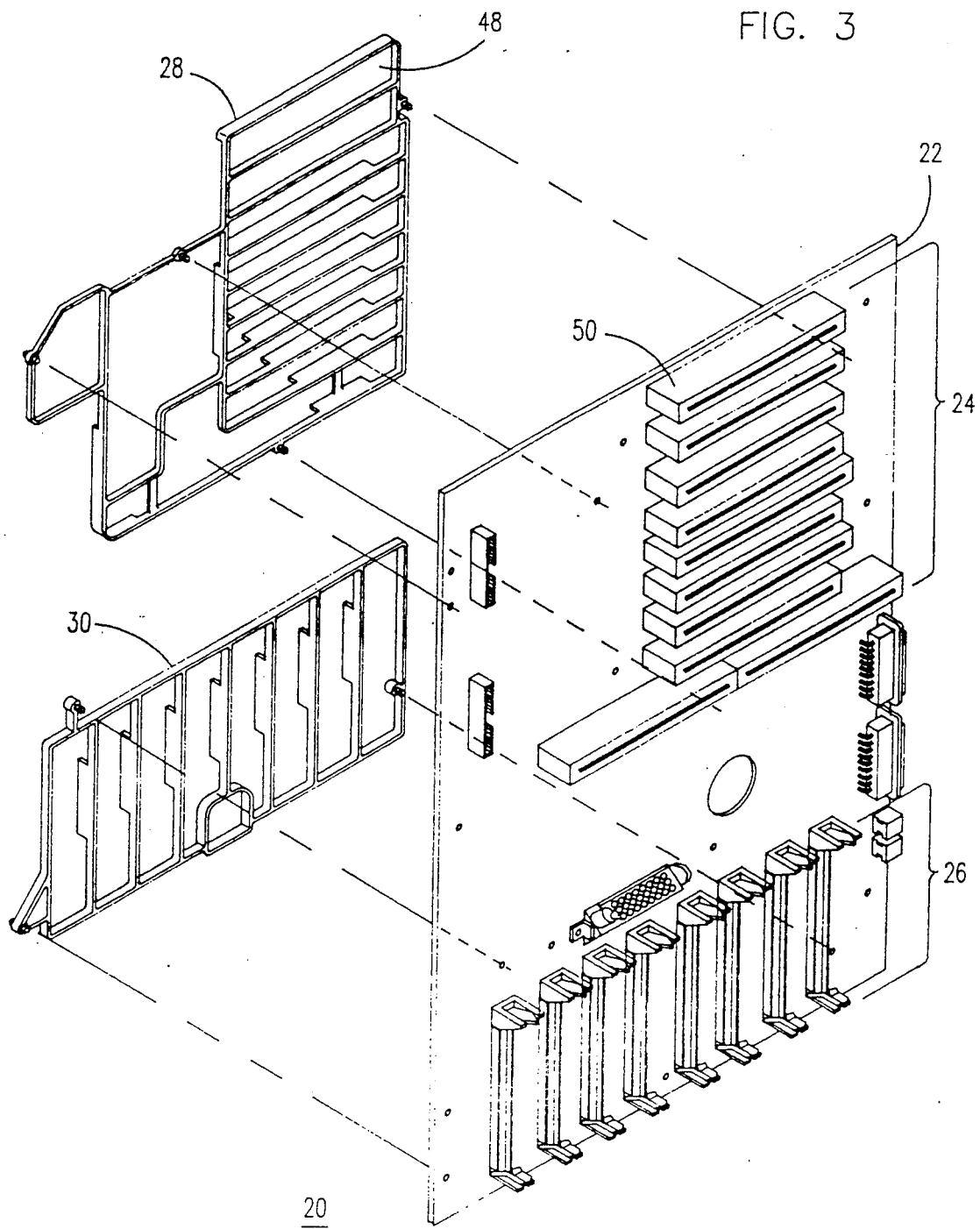
FIG. 3 illustrates the assembly of the planar supports to the planar assembly by use of mounting snaps.

Referring now to FIG. 3, there is shown an exploded view of the planar board assembly 20. FIG. 3 shows the planar 22 being attached to the planar supports 28 and 30, so as to fasten the planar assembly to the inner structure of the enclosure. Each support 28 or 30 is comprised of a plurality of connecter support frames, such as connector support frame 48. It is important to note that each connector support frame of the planar support surrounds a corresponding connector on the planar.

By way of illustration, frame 48 is shown which surrounds a connector 50 of expansion slots 24. The frame 48 generally surrounds the outer edge of the connector 50 to provide support for the connector. Thus each connector of the expansion slot is supported by a frame rather than a single point source of support. As is evident, when an adapter card is inserted into connector 50, the frame 48, around the perimeter of the connector 50 prevents the force from the adapter card inserted on the connector from being transferred to the planar. This prevents any flexing of the connector from being transferred into the planar. Referring also to planar support 30, it is important to note that each frame on planar support 30 surrounds a connector of the expansion slots 26. These slots are used to insert memory or other circuitry components. Again, the frames of support 30 surround the perimeter of corresponding connectors on the planar to prevent the force of the circuitry components being inserted into the connectors from being transferred to the planar. To recapitulate, the planar support structure is interposed between the planar and the inner surface structure and securely fastened to each.

Referring now to FIG. 4, there is illustrated in detail planar support 28 and 30 which provide support for and separation between the planar and the inner structure of the enclosure. The planar supports 28 and 30 are comprised of a plurality of frames in which each frame surrounds a connector of the planar. The frames are integrated into the planar support to form an integral structure. The supports are comprised of plastic or other non-insulating material. Each frame surrounds the edge of a connector on the planar and therefore provides support around the total perimeter of the connectors of the expansion slots.

Also shown in FIG. 4 are a plurality of mounting snaps 52 which are used for easy insertion of these supports into the planar. Each of the snaps is comprised of a first cylindrical portion 54 extending into a second tapered cylindrical portion 56. The tapered cylindrical portion has a circumference greater than the first cylindrical portion. The tapered portion has a gap extending through the tapered portion to permit the circumference of the tapered portion to decrease. The snap is inserted into a corresponding opening, the circumference of the opening being slightly larger than the circumference of the first cylindrical portion, but smaller than the circumference of the tapered portion. Since the circumference of the tapered portion can decrease, the snap can be fitted into the opening. When the opening reaches the first portion the resilient nature of the snap material causes the tapered portion to expand to lock the snap into the opening, thus fastening the support structure to the planar. This type of assembly is very beneficial in automated assembly of the computer system.

Further shown in FIG. 4 are a pair of dual headed alignment pins 44 which are used to align the planar support structure to the inner surface of the enclosure. The alignment pins 44 align the planar to the inner surface to ease insertion of an the fastening of the planar board assembly during assembly of the personal computer system.

The above described embodiment of the invention is illustrative only, and that modifications thereof may occur to those skilled in the art. Accordingly, this invention is not to be regarded as limited to the embodiment disclosed therein, but is to be limited as defined by the appended claims.

We claim:

1. A device for supporting a planar board of a personal computer system, the system being housed in an enclosure having an inner surface, said planar board having a plurality of slots, each slot having a connector to receive a circuitry component, said device comprising:

a plurality of interconnected electrically nonconductive connector support frames, each frame extending around the perimeter of and supporting the edge of a corresponding connector on the planar board, said plurality of support frames being interposed between the planar board and the inner surface of the enclosure to prevent the planar board from flexing whenever a circuitry component is inserted into a slot;

fastening means for attaching said plurality of interconnected connector support frames to said planar board.

2. The device of claim 1 wherein, said nonconductive support frames are comprised of plastic.

3. The device of claim 1, wherein said fastening means are comprised of a plurality of plastic snaps, each of said snaps being comprised of a first cylindrical portion extending into a second tapered cylindrical portion, said tapered cylindrical portion having a circumference greater than the first cylindrical portion, said tapered portion having a gap extending through said tapered portion, said gap permitting the circumference of the tapered portion to decrease to be inserted into an opening having a circumference slightly larger than the circumference of the first portion.

4. A method for supporting a planar board of a personal computer system, the system being housed in an enclosure having an inner surface, said planar board having a plurality of slots, each slot having a connector to receive a circuitry component, said device comprising:

providing a plurality of interconnected electrically nonconductive connector support frames;

extending each frame around the perimeter of a corresponding connector on the planar board to support the planar board;

interposing said plurality of interconnected support frames between the planar board and the inner surface of the enclosure to prevent the planar board from flexing whenever a circuitry component is inserted into a slot;

fastening said planar board and plurality of interconnected connector support frames to the inner surface of the enclosure.

* * * * *